United States Patent
Nagawa et al.

(10) Patent No.: US 7,342,259 B2
(45) Date of Patent: Mar. 11, 2008

(54) OPTICAL ELEMENT

(75) Inventors: Michifumi Nagawa, Fujimi (JP); Tsuyoshi Kaneko, Shimosuwa (JP); Atsushi Sato, Azumino (JP)

(73) Assignee: Seiko Epson Corporation (JP)

( * ) Notice: Subject to any disclaimer, the term of this patent is extended or adjusted under 35 U.S.C. 154(b) by 110 days.

(21) Appl. No.: 11/379,852

(22) Filed: Apr. 24, 2006

(65) Prior Publication Data

US 2006/0269666 A1    Nov. 30, 2006

(30) Foreign Application Priority Data

May 31, 2005    (JP) .............................. 2005-159517

(51) Int. Cl.
*H01L 33/00*    (2006.01)
*H01L 21/00*    (2006.01)
(52) U.S. Cl. .......................................... 257/98; 438/29
(58) Field of Classification Search .................. 257/87, 257/432, 88–98, E33.001–E33.077; 438/29–31, 438/69, 956
See application file for complete search history.

(56) References Cited

U.S. PATENT DOCUMENTS

| 5,528,071 | A | * | 6/1996 | Russell et al. ............... 257/458 |
| 2006/0002440 | A1 | * | 1/2006 | Nagawa et al. .......... 372/44.01 |
| 2006/0008623 | A1 | * | 1/2006 | Nagawa et al. ............. 428/172 |

FOREIGN PATENT DOCUMENTS

JP    2004-031633    1/2004

* cited by examiner

*Primary Examiner*—Calvin Lee
(74) *Attorney, Agent, or Firm*—Harness, Dickey & Pierce, P.L.C.

(57) ABSTRACT

An optical element includes a substrate, a columnar section that is formed above the substrate and has an upper surface for light emission or light incidence, a first protection layer formed above the substrate in a region including at least a circumference of the columnar section, a resin layer formed above the first protection layer, a second protection layer formed above the resin layer, and an electrode that is electrically connected to the upper surface of the columnar section, wherein the first and second protection layers are composed of a material harder than the resin layer.

13 Claims, 5 Drawing Sheets

OPTICAL ELEMENT

The entire disclosure of Japanese Patent Application No. 2005-159517, filed May 31, 2005 is expressly incorporated by reference herein.

BACKGROUND

1. Technical Field

The present invention relates to optical elements.

2. Related Art

An optical element may have a structure that includes a substrate, a columnar section that is formed above the substrate for light emission or light incidence, a resin layer formed around the columnar section, and an electrode electrically connected to an upper surface of the columnar section. For example, Japanese Laid-open Patent Application JP-A-2004-31633 describes a structure in which an additional protective film is provided between a substrate and a polyimide protective film to thereby prevent the polyimide protective film from peeling off.

It is noted that resin is relatively soft, and would likely expand or contract according to changes in temperature. Therefore it is important to prevent its deformation. Also, because resin (for example, a high polymer material such as polyimide resin) has a few permeability to moisture, there is a possibility that exfoliation of layers may occur due to absorption of moisture at an interface between the resin layer and an electrode or between the resin layer and a substrate.

SUMMARY

In accordance with an advantage of some aspects of the present invention, the reliability of optical elements can be improved against environmental changes such as changes in temperature, humidity and the like.

(1) In accordance with an embodiment of the invention, an optical element includes: a substrate; a columnar section that is formed above the substrate and has an upper surface for light emission or light incidence; a first protection layer formed above the substrate in a region including at least a circumference of the columnar section; a resin layer formed above the first protection layer; a second protection layer formed above the resin layer; and an electrode that is electrically connected to the upper surface of the columnar section, wherein the first and second protection layers are composed of a material harder than the resin layer.

According to the embodiment described above, the first and second protection layers are composed of a material harder than the resin layer, such that these protection layers act to press the resin layer from both sides thereof whereby deformation of the resin layer can be effectively prevented. Also, the first and second protection layers can improve adhesion and moisture-resistant property, such that exfoliation of the resin layer can be effectively prevented.

It is noted that, in the invention, a member B being provided above a specific member A may include a case where B is provided directly on A, and a case where B is provided over A through another layer or the like on A. This similarly applied to other embodiments of the invention to be described below.

(2) In the optical element, the electrode may be formed to extend from the upper surface of the columnar section to an area above the resin layer, and may have a pad section above the resin layer.

(3) In the optical element, the first protection layer may be formed on a side surface of the columnar section and on an edge section of the upper surface of the columnar section.

By this, for example, harmful effects that may be caused by unintended oxidation of the columnar section due to infiltration of moisture content can be prevented. Also, adhesion strength between the resin layer and the columnar section is improved, and thus the resin layer can be effectively prevented from peeling off.

(4) In the optical element, the second protection layer may be present between the resin layer and the electrode.

By this, because the second protection layer composed of a material harder than the resin layer serves as a base of the electrode, for example, the electrode can be bonded well to a pad section.

(5) In the optical element, the second protection layer may be formed to extend to an inner side of the upper surface of the columnar section farther inside than the first protection layer and the resin layer.

By this, deformation of the resin layer can be more effectively prevented.

(6) In the optical element, the second protection layer may be formed above the electrode.

By this, exfoliation and oxidation of the electrode can be better prevented.

(7) In the optical element, the second protection layer may be formed to extend to an inner side of the upper surface of the columnar section farther inside than the first protection layer, the resin layer and the electrode.

By this, deformation of the resin layer can be more effectively prevented.

(8) The optical element may farther include a third protection layer formed between the resin layer and the electrode, wherein the third protection layer may be composed of a material harder than the resin layer.

By this, because the third protection layer composed of a material harder than the resin layer serves as a base of the electrode, for example, the electrode can be bonded well to a pad section.

(9) In the optical element, at least one of the first and second protection layers may cover an inner region on the upper surface of the columnar section farther inside than the electrode on the upper surface of the columnar section.

By this, the light emission region or incidence region of the columnar section can be protected.

(10) In the optical element, both of the first and second protection layers may cover an inner region on the upper surface of the columnar section farther inside than the electrode on the upper surface of the columnar section, and the first and second protection layers may have mutually different refractive indexes.

By this, the light emission region or incidence region of the columnar section can be protected by the first and second protection layers, and for example, the first and second protection layers can also be functioned as mirrors.

(11) In the optical element, at least one of the first and second protection layers may include a compound of silicon, and oxygen or nitrogen.

DESCRIPTION OF EXEMPLARY EMBODIMENTS

Exemplary embodiments of the invention are described below with reference to the accompanying drawings.

A. Optical Element

Figure 1:
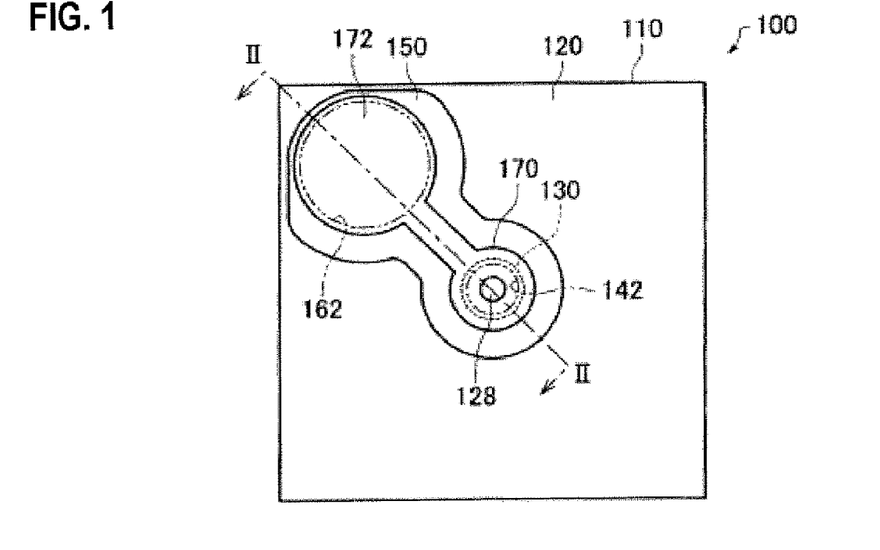
FIG. 1 is a plan view of an optical element in accordance with an embodiment of the invention.
Figure 2:
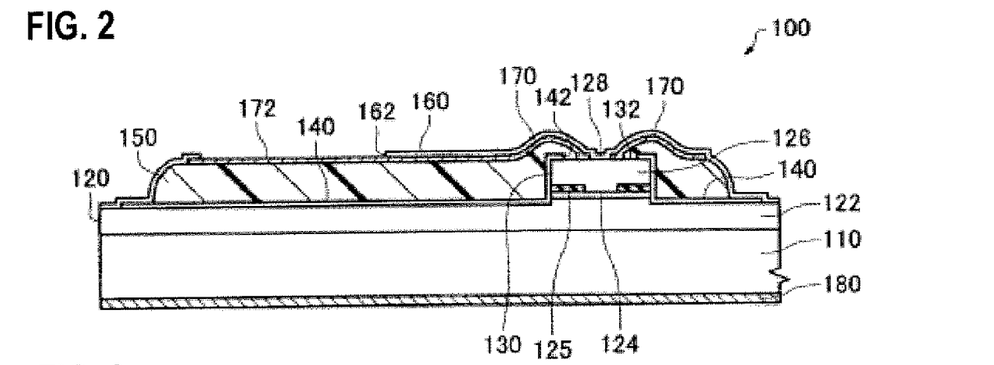
FIG. 2 is a cross-sectional view of the optical element in accordance with the present embodiment.

FIG. 1 is a plan view of an optical element in accordance with an embodiment of the invention, and FIG. 2 is a cross-sectional view taken along a line II-II in FIG. 1.

The optical element 100 includes a substrate 110, an element section 120 (including a columnar section 130), a first protection layer 140, a resin layer 150, a second protection layer 160, an electrode 170, and another electrode 180. In the present embodiment, an example in which the optical element 100 is a surface-emitting type device (surface-emitting type semiconductor laser) is described.

(A-1) First, the substrate 110 and the element section 120 are described.

The substrate 110 is a semiconductor substrate (for example, an n-type GaAs substrate). The element section 120 is formed on the substrate 110. The substrate 110 and the element section 120 may have the same plane configuration (for example, a rectangle). In the case of a surface-emitting type semiconductor laser, the element section 120 is referred to as a resonator (or a vertical resonator).

The element section 120 includes the columnar section 130. As shown in FIG. 2, the element section 120 may have a convex cross-sectional shape, and a protruded section of the convex cross-sectional shape may define the columnar section 130. The columnar section 130 may have a side surface that is vertical or a positively tapered with respect to the substrate surface. The columnar section 130 may have a plane configuration that is in a circular shape, a rectangular (square or oblong) shape or other polygonal shapes. In the example shown in FIG. 1, a single columnar section 130 is formed on a single substrate 110, but a plurality of columnar sections 130 may be formed thereon. A central portion of the upper surface 132 of the columnar section 130 defines an optical surface for emission or incidence of light (laser beam) (an emission surface in the case of a surface-emitting type semiconductor laser) 128. The optical surface 128 is exposed through the resin layer 150 and the electrode 170.

The element section 120 is formed from, for example, a first mirror (a first semiconductor layer in a wider sense) 122 that is a distributed reflection type multilayer mirror of 40 pairs of alternately laminated n-type $Al_{0.9}Ga_{0.1}As$ layers and n-type $Al_{0.15}Ga_{0.85}As$ layers, an active layer 124 (a functional layer in a wider sense) that is composed of GaAs well layers and $Al_{0.3}Ga_{0.7}As$ barrier layers in which the well layers include a quantum well structure composed of three layers, and a second mirror (a second semiconductor layer in a wider sense) 126 that is a distributed reflection type multilayer mirror of 25 pairs of alternately laminated p-type $Al_{0.9}Ga_{0.1}As$ layers and p-type $Al_{0.15}Ga_{0.85}As$ layers, which are successively laminated. It is noted that the composition of each layer and the number of layers composing the first mirror 122, the active layer 124 and the second mirror 126 may not be limited to the above. Also, the active layer 124 includes a layer in which recombinations of carriers occur, and may have a single quantum well structure or a multiple quantum well structure.

The second mirror 126 is made to be p-type by doping, for example, C, Zn or Mg, and the first mirror 122 is made to be n-type by doping, for example, Si or Se. Accordingly, a pin diode is formed with the second mirror 126, the active layer 124 in which no impurity is doped, and the first mirror 122.

A current constricting layer 125 composed of aluminum oxide as the main component is formed in a region near the active layer 124 among the layers composing the second mirror 126. The current constricting layer 125 may be formed in a ring shape. In other words, the current constricting layer 125 has a cross section defined by concentric circles when cut in a plane parallel with the optical surface 128.

The columnar section 130 refers to a semiconductor laminated body including at least the second mirror 126 (in the example shown in FIG. 2, the second mirror 126, the active layer 124 and a portion of the first mirror 122). The columnar section 130 is supported on the substrate 110.

(A-2) Next, the resin layer 150 is described.

The resin layer 150 is formed over the substrate 110 (the element section 120) through the first protection layer 140. As shown in FIG. 1, the resin layer 150 is formed in a region including at least the circumference of the columnar section 130. Also, the resin layer 150 is formed as a base of the electrode 170 (the pad section 172 in particular). By this, planarization of the surface becomes possible, and patterning of the electrode would become easier. Also, by placing the resin with a low dielectric constant between the element section 120 and the electrode 170, the parasitic capacitance can be reduced. It is noted that the resin layer 150 may be formed to a thickness that is generally the same as that of the columnar section 130.

When the resin layer 150 does not have an optical transparency, the resin layer 150 is formed in a region that avoids at least the optical surface 128. In the example shown in FIG. 2, the resin layer 150 is formed to cover the side surface of the columnar section 130, cover a boundary (a corner section) between the upper surface 132 and the side surface of the columnar section 130, and extend to an end section of the upper surface 132 of the columnar section 130.

Alternatively, as a modified example, the resin layer 150 may be formed in an area that avoids the entire area of the upper surface 132 of the columnar section 130. In this case, the upper surface of the resin layer 150 and the upper surface 132 of the columnar section 130 may be made generally flush with each other such that a step difference is not generated at the boundary between the columnar section 130 and the resin layer 150.

Also, the resin layer 150 may be formed continuously along the rim (i.e., along the entire periphery) of the upper surface 132 of the columnar section 130. Also, the resin layer 150 may be smoothly sloped such that it gradually thins from the rim of the columnar section 130 toward its center, whereby disconnection of the electrode 170 can be effectively prevented.

The resin layer 150 may be formed with, for example, polyimide resin, fluorine type resin, acrylic resin, or epoxy resin.

(A-3) Next, the electrode 170 and the other electrode 180 are described.

The electrode 170 is electrically connected to the upper surface 132 of the columnar section 130. For example, the electrode 170 is electrically connected to the second mirror 126 at an end section of the upper surface 132 of the columnar section 130 (in other words, in a region that avoids the optical surface 128). Also, in the example shown in FIG. 1, the electrode 170 is formed continuously along the rim (i.e., along the entire periphery) of the upper surface 132 of the columnar section 130, and its connecting area with the second mirror 126 forms a ring shape. A portion that is exposed through the inner opening of the electrode 170 defines the optical surface 128. The electrode 170 may be formed from a laminated film of layers of, for example, an alloy of Au and Zn, and Au.

The electrode 170 is formed in a manner to extend from the upper surface 132 of the columnar section 130 over the resin layer 150, and has a pad section 172 on the resin layer 170. The pad section 172 is an external electrical connection section, and may include a bonding region for bonding a conductive material (not shown) such as a wire and a bump. When a portion of the electrode 170 that connects the pad section 172 and the columnar section 130 serves as a wiring section, the width of the pad section 172 may be made wider than the wiring section.

The other electrode 180 is electrically connected to a portion on the side of the first mirror 122. The other electrode 180 may be formed on the back surface of the substrate 110, or a portion of the substrate 110 (the element section 120) may be exposed through the resin layer 150, and the other electrode 180 may be connected to the exposed portion. The electrode 180 may be formed from a laminated film of layers of, for example, an alloy of Au and Ge, and Au.

An electric current can be injected in the active layer 124 between the first and second mirrors 122 and 126 by the electrodes 170 and 180. It is noted that the material of the electrodes 170 and 180 is not limited to those described above, but other metals such as Ti, Ni, Au, Pt, and an alloy of at least two of the aforementioned metals can be used.

(A-4) Next, the first and second protection layers 140 and 160 are described.

The first protection layer 140 is formed on the substrate 110 (above the element section 120 in FIG. 2). In other words, the first protection layer 140 is formed between the substrate 110 (the element section 120) and the resin layer 150. Also, the first protection layer 140 is formed in a region that includes at least the circumference of the columnar section 130. For example, the first protection layer 140 may have a plane area that is generally the same as or slightly smaller than the plane area of the substrate 110 (see FIG. 2).

As shown in FIG. 2, the first protection layer 140 may be formed to cover the side surface (for example, the entire side surface) of the columnar section 130, to cover the boundary (for example, the entire boundary) between the upper surface 132 of the columnar section 130 and its side surface, and to reach the end section of the upper surface 132 of the columnar section 130. For example, in the example shown in FIG. 1, the first protection layer 140 is formed continuously along the rim (i.e., along the entire periphery) of the upper surface 132 of the columnar section 130, and is provided with an opening section 142 inside the upper surface 132 of the columnar section 130.

As shown in FIG. 2, when the first protection layer 140 is formed in the end section of the upper surface 132 of the columnar section 130, the resin layer 150 may be formed to extend farther inside than the first protection layer 140, and the electrode 170 may be formed to extend farther inside than the resin layer 150.

It is noted that, as a modified example, the first protection layer 140 may be formed to cover only the side surface of the columnar section 130, while avoiding the upper surface 132 of the columnar section 130.

As a result, the first protection layer 140 not only protects the substrate 110 (the element section 120), but also improves the adhesion strength between the substrate 110 (the element section 120) and the resin layer 150. Also, because the first protection layer 140 can prevent infiltration of moisture, for example, exfoliation of layers that may be caused by moisture slightly contained in the resin layer 150 can be prevented. Moreover, when the first protection layer 140 is also formed around the columnar section 130 as described above, harmful effects (for example, expansion of the current constricting layer 125, changes in the refractive index of the semiconductor layer caused by oxidation, and the like) that may be caused by unintended oxidation of the columnar section due to infiltration of moisture can be prevented. Also, adhesion strength between the resin layer 150 and the columnar section 130 can be improved.

(A-5) In the example shown in FIG. 2, the second protection layer 160 is formed over the resin layer 150 through the electrode 170. The second protection layer 160 is formed on the electrode 170 while exposing the pad section 172. The second protection layer 160 may expose only a central area of the pad section 172, or may expose the entire pad section 172. In the former case, as shown in FIG. 1, an opening section 162 of the second protection layer 160 is located inside the pad section 172. Because the pad section 172 is exposed through the opening section 162, an external electrical connection can be made.

The second protection layer 160 may generally entirely cover the electrode 170 except the pad section 172, and may cover the entire exposed area of the resin layer 150, which is exposed through the electrode 170. Moreover, the second protection layer 160 may cover a region outside the resin layer 150 (the first protection layer 140 or the substrate 110 (the element section 120)). The plane area of the second protection layer 160 may be generally the same as the plane area of the substrate 110.

As shown in FIG. 2, the second protection layer 160 may be formed to extend to an inner side of the upper surface 132 of the columnar section 130 farther inside than the first protection layer 140, the resin layer 150 and the electrode 170. Also, the second protection layer 160 may be formed in a manner to avoid the optical surface 128 of the columnar section 130, but may be formed to cover an area of the upper surface 132 of the columnar section 130 farther inside than the electrode 170, in other words, to cover the optical surface 128 (in its entirety). If the optical surface 128 is covered by the second protection layer 160, the optical surface 128 would not be exposed to external environments, such that the reliability can be further improved. Also, by appropriately adjusting the film forming process (for example, process temperature and pressure in a CVD method, and the like) for the second protection layer 160, its thickness, and the like, the second protection layer 160 can be functioned as a mirror. In other words, by adjusting the refractive index of the second protection layer 160 to be different from that of the base layer (i.e., the topmost layer (e.g., an (Al) GaAs layer with a lower Al composition) of the second mirror 126 in FIG. 2), the second protection layer 160 can be made to contribute to light emission or light incidence. By this, for example, the second mirror 126 can be made thinner, and the resistance of the element can be lowered.

It is noted that, in the example shown in FIG. 2, the second protection layer 160 is formed to cover the entire surface of the substrate 110 except the pad section 172.

According to the embodiment described above, because the second protection layer 160 is provided on the topmost layer, the reliability of the element is very high against external environments. More specifically, the second protection layer 160 prevents infiltration of moisture from outside, such that the moisture resistant property of the element can be improved. Moreover, because the second protection layer 160 covers the electrode 170, harmful effects such as damages, exfoliation and oxidation of the electrode 170 can be prevented.

(A-6) The first and second protection layers are formed from a material harder (a material with a greater Young's modulus) than the resin layer 150. For example, a material with a Young's modulus of about 0.3 GPa-5 GPa may be used for the resin layer 150, and a material with a Young's modulus of about 10 GPa-100 GPa may be used for the first and second protection layers 140 and 160. At least one of the first and second protection layers 140 and 160 may be formed from an insulation material, and may be formed from, for example, an inorganic material such as an oxide or a nitride. For example, at least one of the first and second protection layers 140 and 160 may be formed from a compound of silicon, and oxygen or nitrogen, such as, for example, silicon oxide, silicon nitride, or PSG (phosphosilicate glass). Alternatively, at least one of the first and second protection layers 140 and 160 may be formed from an organic material. At least one of the first and second protection layers 140 and 160 has optical transparency. It is noted that the first and second protection layers 140 and 160 may be formed from the same material, or mutually different materials. Also, each of the first and second protection layers 140 and 160 may be composed of a single layer or a plurality of layers.

According to the optical element of the present embodiment, the first and second protection layers 140 and 160 are formed from a material harder than the resin layer 150, and therefore act to press the resin layer 150 from both sides, such that deformation of the resin layer 150 can be effectively prevented. More specifically, deformation of the resin layer 150 that may be originated from changes in temperature, humidity or stress at the time of mounting can be effectively prevented. Also, the first and second protection layers 140 and 160 can improve adhesion and moisture-resistant property, such that exfoliation of the resin layer can be effectively prevented. Moreover, because the first and second protection layers 140 and 160 can protect the element section 120 (the columnar section 130), damages to the optical element (for example, cracks in the resin layer), and deterioration or change in the characteristics (for example, characteristics such as the current-output property, the radiation angle and the like), which may be originated from changes in the external environment (such as, temperature, humidity, the use of plasma-organic solvent and the like) during the process, can be prevented. Accordingly, the reliability against environmental changes can be improved.

(A-7) It is noted that the optical element in accordance with the present embodiment is not limited to surface-emitting type semiconductor lasers, but is also applicable to other types of light emitting elements (such as, for example, a semiconductor light emitting diode, and an organic LED), or to light receiving elements (such as, for example, photo-diodes). In the case of a light receiving element, the optical surface 128 of the columnar section 130 defines a light incidence surface. In the case of a light receiving element, the element has at least a photoabsorption layer (a functional layer in a wider sense). Also, in this case, semiconductor layers (also referred to as contact layers) may often be provided above and below the photoabsorption layer.

Further, the p-type or n-type property in each of the semiconductor layers described above can be interchanged. Although the example above is described with reference to AlGaAs type material, other materials, such as, for example, GaInP type, ZnSSe type, InGaN type, AlGaN type, InGaAs type, GaInNAs type, and GaAsSb type semiconductor materials may be used according to specified oscillation frequencies.

B. Method for Manufacturing Optical Element

FIGS. 3 through 11 are views showing a method for manufacturing an optical element in accordance with an embodiment of the invention.

Figure 3:
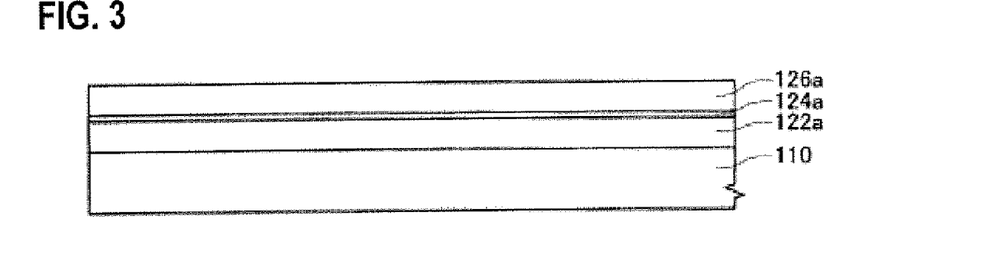
FIG. 3 is a view showing a step of a method for manufacturing an optical element in accordance with an embodiment of the invention.
Figure 4:
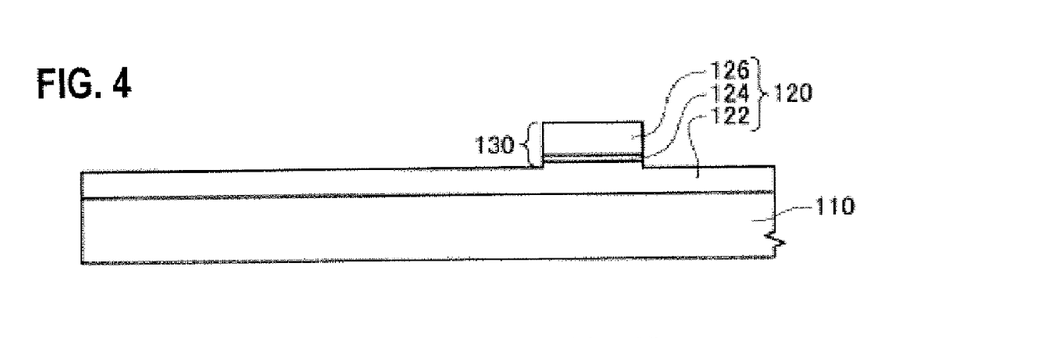
FIG. 4 is a view showing a step of the method for manufacturing an optical element in accordance with the embodiment.
Figure 5:
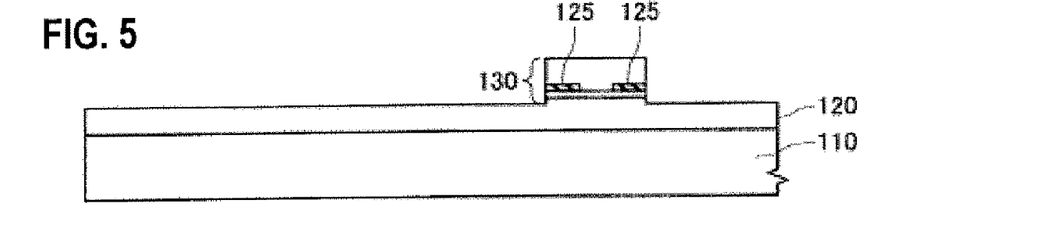
FIG. 5 is a view showing a step of the method for manufacturing an optical element in accordance with the embodiment.

(B-1) First, as shown in FIGS. 3 through 5, an element section 120 including a columnar section 130 is formed on a substrate 110.

As shown in FIG. 3, on the surface of the semiconductor substrate 110 composed of n-type GaAs, a semiconductor multilayer film is formed by epitaxial growth while varying the composition. It is noted here that the semiconductor multilayer film is formed from, for example, a first mirror 122 of 40 pairs of alternately laminated n-type $Al_{0.9}Ga_{0.1}As$ layers and n-type $Al_{0.15}Ga_{0.85}As$ layers, an active layer 124 composed of GaAs well layers and $Al_{0.3}Ga_{0.7}As$ barrier layers in which the well layers include a quantum well structure composed of three layers, and a second mirror 126 of 25 pairs of alternately laminated p-type $Al_{0.9}Ga_{0.1}As$ layers and p-type $Al_{0.15}Ga_{0.85}As$ layers.

When growing the second mirror 126, at least one layer adjacent to the active layer 124 may be formed as an AlAs layer or an AlGaAs layer with an Al composition being 0.95 or higher. This layer is later oxidized and becomes a current constriction layer 125 (see FIG. 5). Also, the layer at the topmost surface of the second mirror 126 may preferably be formed to have a high carrier density, such that an ohmic contact can be readily made with an electrode 170.

The temperature at which the epitaxial growth is conducted is appropriately decided depending on the growth method, the kind of raw material, the type of the semiconductor substrate 110, and the kind, thickness and carrier density of the semiconductor multilayer film to be formed, and in general may preferably be 450° C.-800° C. Also, the time required for conducting the epitaxial growth is appropriately decided just like the temperature. Also, a metal-organic chemical vapor deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Then, a resist layer (not shown) patterned in a predetermined shape is formed on the semiconductor multilayer film. By using the resist layer as a mask, the second mirror 126, the active layer 124 and a part of the first mirror 122 are etched by, for example, a dry etching method, thereby forming a columnar section 130, as shown in FIG. 4.

Next, as shown in FIG. 5, by placing the semiconductor substrate 110 on which the columnar section 130 is formed in a water vapor atmosphere at about 400° C., for example, a layer having a high Al composition (a layer with an Al composition being 0.95 or higher) provided in the above-described second mirror 126 is oxidized from its side surface, thereby forming the current constriction layer 125. The oxidation rate depends on the furnace temperature, the amount of water vapor that is supplied, and the Al composition and the film thickness of the layer to be oxidized. When the surface-emitting type semiconductor laser equipped with the current constricting layer 125 described above is driven, an electric current flows only in a portion where the current constricting layer 125 is not formed (i.e., a portion that has not been oxidized). Accordingly, the current density can be controlled by controlling the forming region of the current constricting layer 125 in the process of forming the current constricting layer 125 by oxidation.

Figure 6:
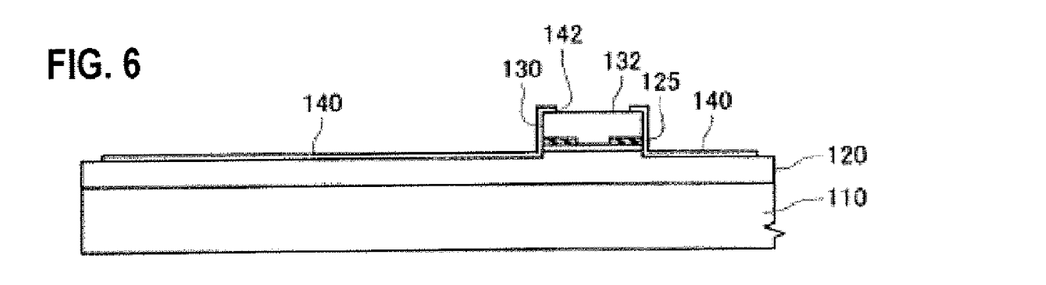
FIG. 6 is a view showing a step of the method for manufacturing an optical element in accordance with the embodiment.

(B-2) Next, as shown in FIG. 6, a first protection layer 140 is formed.

The first protection layer 140 may be formed through forming a film on the surface of the element section 120 by a CVD method (for example, a plasma CVD method), a sputter method or a vapor deposition method, and then patterning the film in a predetermined region by a dry etching method (for example, an RIE (reactive ion etching) method). As the etching gas for dry etching, for example, $CF_4$ can be used. In this manner, as shown in FIG. 6, an upper surface 132 of the columnar section 130 is exposed through an opening section 142 of the first protection layer 140. In the example shown in FIG. 6, an end section of the upper surface 132 of the columnar section 130 is covered by the first protection layer 140, and only a central area of the upper surface 132 of the columnar section 130 is exposed. By exposing at least a portion of the upper surface 132 of the columnar section 130, electrical connection with an electrode 170 can be secured.

Figure 7:
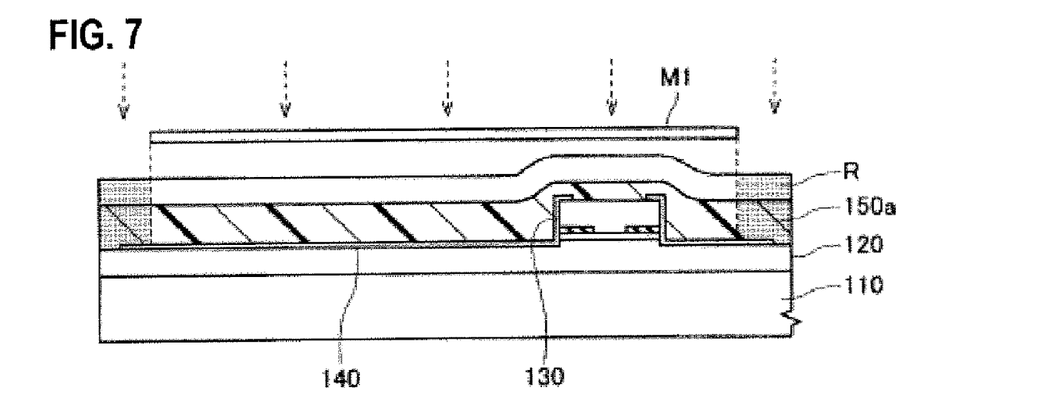
FIG. 7 is a view showing a step of the method for manufacturing an optical element in accordance with the embodiment.

(B-3) Next, as shown in FIGS. 7 though 10, a resin layer 150 is formed.

The resin layer 150 may be formed through first providing a precursor layer 150a to cover the entire surface of the element section 120, and then patterning the precursor layer 150a.

More specifically, first, as shown in FIG. 7, the precursor layer 150a is provided over the element section 120 by, for example, a spin coat method, a dipping method, or a spray coat method. Next, the precursor layer 150a is patterned in a predetermined shape. In the present example, a precursor layer having photosensitivity is used as the precursor layer 150a. A photosensitive resist layer R is formed on the precursor layer 150a, and the resist layer R and the precursor layer 150a are patterned at the same time by exposure and development steps (dissolving and removal steps) with the photolithography technique.

Prior to the exposure and development steps described above, the precursor layer 150a may be pre-baked at, for example, about 80-100° C., to thereby evaporate the solvent in the precursor layer 150a. By so doing, the dissolving and removal rate at the time of the development step can be made uniform. Also, by the pre-baking treatment, the dissolving rate of the precursor layer 150a can be made lower than the dissolving rate of the resist layer R.

For example, first patterning may be conducted to form an outer rim of the precursor layer 150a. Concretely, a mask M1 is disposed above a region including the columnar section 130, and light energy is irradiated. Light energy is irradiated to a region of the resist layer R and the precursor layer 150a which is exposed through the mask M1. In this manner, the resist layer R and the precursor layer 150a are exposed at the same time. Then, by dipping the layers in a developing solution, the portions irradiated with light energy are removed at the same time. It is noted that, in the example shown in FIG. 7, the resist layer R and the precursor layer 150a are both formed from a positive type material whose dissolubility at irradiated portions increases. Inversely, a negative type material whose dissolubility at exposed portions decreases can also be used. In the case of a negative type material, masks to be used in FIG. 7 and FIG. 8 have inverted configurations, compared to a positive type material.

Figure 8:
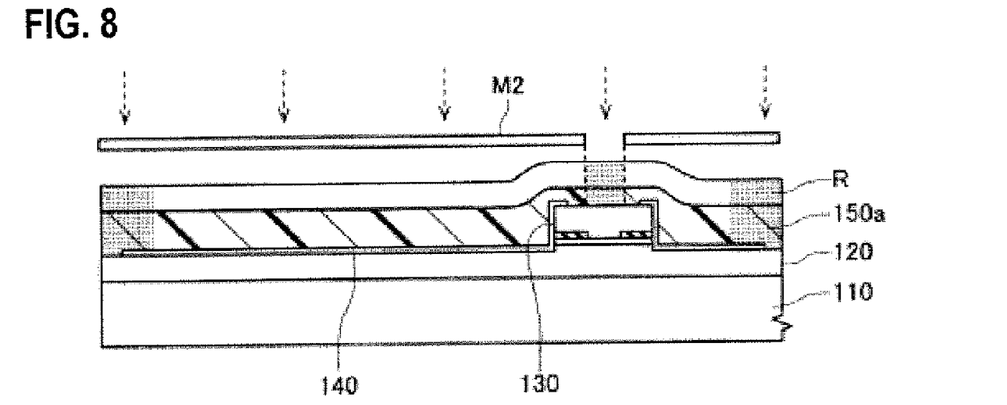
FIG. 8 is a view showing a step of the method for manufacturing an optical element in accordance with the embodiment.

Then, second patterning is conducted to expose an upper surface 132 (for example, a central area) of the columnar section 130. Concretely, as shown in FIG. 8, a mask M2 defining an opening at the central area of the upper surface 132 of the columnar section 130 is disposed, and light energy is irradiated. Then, the resist layer R and the precursor layer 150a are exposed and developed at the same time. In the second patterning step, the resist layer R that is left in the first patterning step is used as it is.

By patterning the precursor layer 150a multiple times as described above, an optimum exposure and development time can be secured at each of the steps. In other words, by optimizing each of the patterning steps, the patterning accuracy can be improved.

Figure 9:
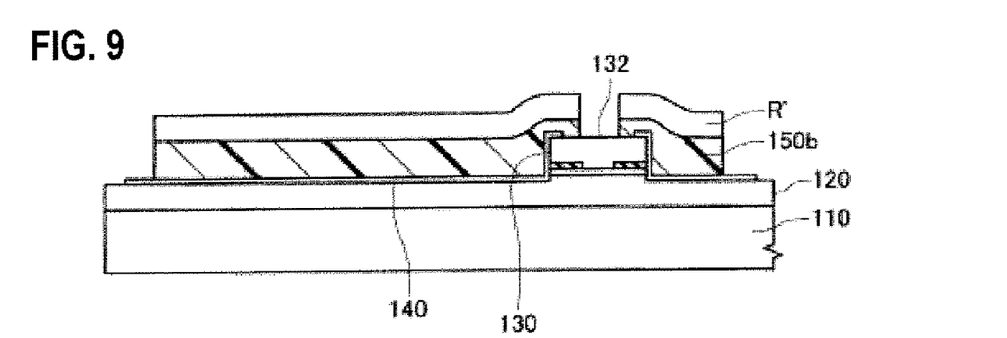
FIG. 9 is a view showing a step of the method for manufacturing an optical element in accordance with the embodiment.

In this manner, as shown in FIG. 9, a precursor layer 150b and a resist layer R' can be formed over the element section 120. The precursor layer 150b and the resist layer R' can be formed not only around the columnar section 130, but also on the end section of the upper surface 132 of the columnar section 130.

Figure 10:
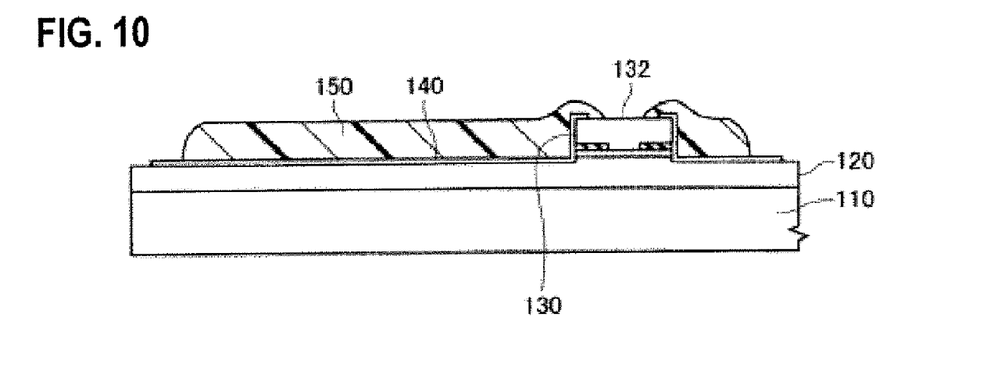
FIG. 10 is a view showing a step of the method for manufacturing an optical element in accordance with the embodiment.

Then, the resist layer R' is removed. Resist thinner (for example, LB thinner (trade name)) may be used to dissolve and remove the resist R' (by wet etching). In this case, because the first protection layer 140 is formed, the element section 120 can be protected from the solvent or the like for removing the resist layer R'. It is noted here that the precursor layer 150b that has undergone pre-backing has a lower dissolving removal rate compared to the resist layer R', and therefore the resist layer R' is entirely removed, while only a surface layer portion of the precursor layer 150b is removed. As a result, as shown in FIG. 10, after the resist layer R' has been removed, the resin layer 150 having a smooth curved upper surface can be formed. For example, over the upper surface 132 of the columnar section 130, the resin layer 150 can be gently sloped such that it gradually thins from the rim of the columnar section 130 toward its center.

After patterning, the precursor layer 150b may be heated to, for example, about 350° C. to be hardened and contracted, whereby the resin layer 150 shown in FIG. 10 can be formed. In this case, because the element section 120 is covered by the first protection layer 140, transformation (for example, advancement of oxidation) of the element section 120 (the columnar section 130 in particular), which may be caused by the high temperature processing, can be prevented.

As modified examples of the exemplary embodiment described above, the resin layer 150 may be formed by a single patterning step, the resist layer 150 may be formed while omitting formation of the resist layer R, or the resist layer 150 may be formed by using a non-photosensitive resin layer and patterning the layer by etching. Alternatively, by using a droplet discharge method (for example, an ink jet method) or a printing method (for example, a screen printing method), the resin layer 150 having a predetermined pattern may be directly formed.

Figure 11:
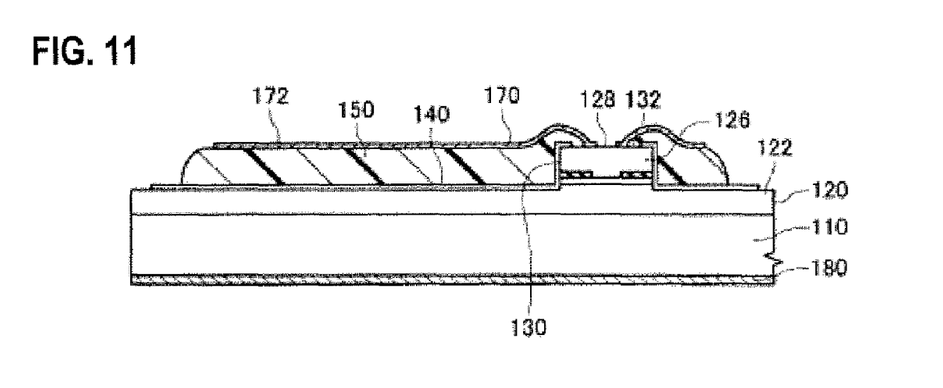
FIG. 11 is a view showing a step of the method for manufacturing an optical element in accordance with the embodiment.

(B-4) Next, as shown in FIG. 11, an electrode 170 and another electrode 180 are formed. The electrode 170 is electrically connected to the second mirror 126, and the electrode 180 is electrically connected to the first mirror 122.

The electrode 170 is formed on the upper surface 132 of the columnar section 130 and the resin layer 150 through forming a film by, for example, a vacuum vapor deposition method, and removing a portion thereof by a lift-off method, whereby the electrode 170 is patterned in a predetermined configuration. Alternatively, a dry etching method can be used instead of a lift-off method. The electrode 170 may be formed in a single layer or a plurality of layers. In the case of multiple layers, the layers may be formed from different materials, respectively. Prior to forming the electrode 170, an area to be covered by the film may be washed by a plasma treatment if necessary. Also, after or during formation of the electrode 170, an anneal treatment (alloying treatment) may be conducted at high temperatures of, for example, about 350° C. It is noted that the other electrode 180 can be formed, for example, at the back surface of the substrate 110, by a forming method similar to the method described above for the electrode 170.

(B-5) Then, a second protection layer 160 is formed (see FIG. 2).

The details described above for the first protection layer 140 can be applied to the material and film forming method for the second protection layer 160. The second protection layer 160 is formed, for example, over the entire surface (including the optical surface 128) of the element section 120. When the second protection layer 160 has optical transparency, the columnar section 130 including the optical surface 128 can be protected from external environments without blocking the light path. By forming the second protection layer 160 thicker, its protection property can be improved.

The details of the optical element described above can be applied to other details and effects of the method for manufacturing an optical element in accordance with the present embodiment.

C. Modified Examples

Figure 12:
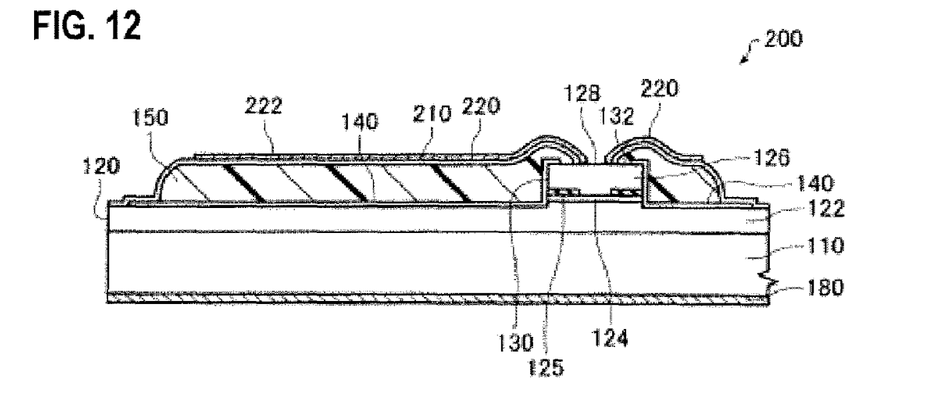
FIG. 12 is a view showing a step of a method for manufacturing an optical element in accordance with a modified example the embodiment of the invention.
Figure 13:
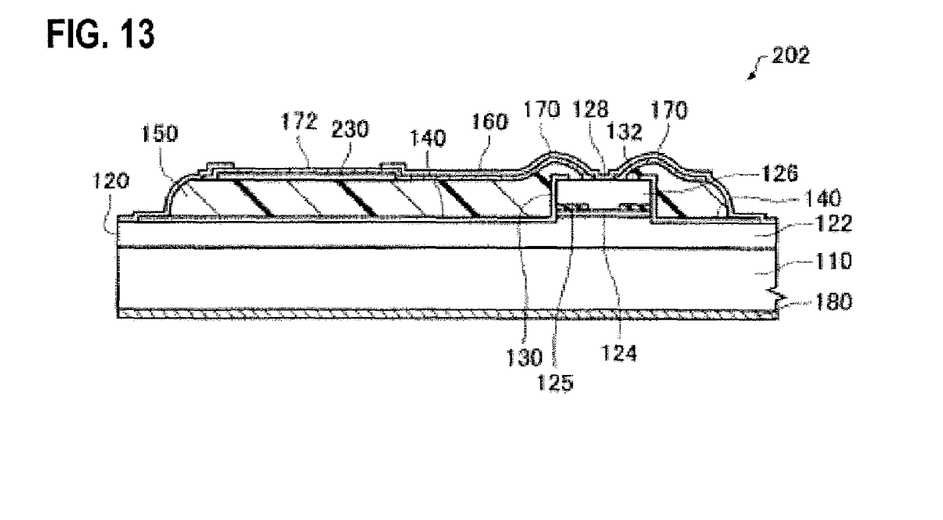
FIG. 13 is a view showing a step of a method for manufacturing an optical element in accordance with another modified example the embodiment of the invention.
Figure 14:
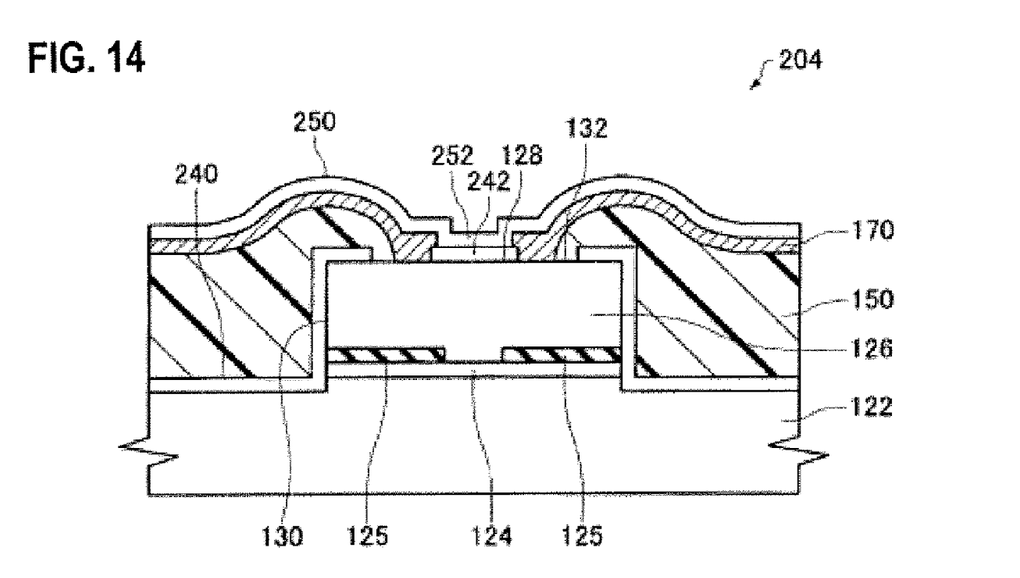
FIG. 14 is a view showing a step of a method for manufacturing an optical element in accordance with another modified example the embodiment of the invention.

FIGS. 12 through 14 are views showing modified examples in accordance with the embodiment of the invention. In the modified examples, aspects different from the embodiment described above are described.

(C-1) FIG. 12 is a view showing a first modified example of the present embodiment. An optical element 200 of the modified example has a second protection layer 210 provided between a resin layer 150 and an electrode 220. In other words, the second protection layer 210 is formed as a base of the electrode 220 (including a pad section 222). By this, the second protection layer 210 composed of a material harder than the resin layer 150 serves as a base layer of the electrode 220, for example, such that bonding (for example, wire bonding) to the pad section 222 of the electrode 220 can be made well.

Also, the second protection layer 210 is formed to cover entirely the resin layer 150. Also, the second protection layer 210 is formed in a manner to expose at least a portion of the upper surface 132 of the columnar section 130. By so doing, electrical conduction to the electrode 170 can be secured.

It is noted that, in the example shown in FIG. 12, the second protection layer 210 is formed to reach an inner side of the upper surface 132 of the columnar section 130 farther inside than the first protection layer 140 and the resin layer 150.

According to the present modified example, the second protection layer 210 composed of a material harder than the resin layer 150 is formed as a base layer of the electrode 220, such that, for example, when a conductive member or the like is bonded to the pad section 222, the required load can be sufficiently applied, and the conductive member (for example, a wire ball) can be bonded well to the pad section 222. Also, as the resin layer 150 is directly pressed by the lower and upper layers, deformation of the resin layer 150 can be more effectively prevented.

(C-2) FIG. 13 is a view showing a second modified example in accordance with the present embodiment. An optical element 202 of the modified example further includes a third protection layer 230, in addition to the composition of the optical element 100.

The third protection layer 230 is formed between a resin layer 150 and an electrode 170, and is composed of a material harder than the resin layer 150. The details of the first and second protection layers 140 and 160 can be applied to details of the third protection layer 230, and the third protection layer 230 can be formed from, for example, silicon oxide, or silicon nitride.

As shown in FIG. 13, the third protection layer 230 may be formed in a region (only) of at least the pad section 172. By this, good bonding described above can be realized. Alternatively, the third protection layer 230 may be formed to cover the entire area of the resin layer 150.

According to the modified example, in addition to the effects derived from the composition of the optical element 100 described above, the effects described in the first modified example can be obtained.

(C-3) FIG. 14 is a view showing a third modified example in accordance with the present embodiment. An optical element 204 of the present modified example has first and second protection layers 240 and 250 that have configurations different from those of the optical element 100.

The first protection layer 240 is formed to cover the side surface (for example, the entire side surface) of a columnar section 130, covers a boundary (for example, the entire boundary) between an upper surface 132 of the columnar section 130 and its side surface, and to extend to an end section of the upper surface 132 of the columnar section 130. Also, the first protection layer 240 has a first covering section 242 that covers an inner region of the upper surface 132 of the columnar section 130 farther inside than the electrode 170. The first covering section 242 covers entirely a so-called optical surface 128.

In accordance with the present modified example, because the optical surface 128 is covered, changes in the optical constant and the like can be prevented, and the reliability against changes in the external environment can be further improved. In particular, damages to the optical element or deterioration or changes in its characteristics, which may be caused by a high-temperature process, an etching process and the like in the process for forming the resin layer 150 and the electrode 170, can be effectively prevented.

As shown in FIG. 14, when the second protection layer 250 is provided to cover the optical surface 128, the first covering section 242 of the first protection layer 240 and a second covering section 252 of the second protection layer 250 are laminated over the optical surface 128. In this case, the first and second protection layers 240 and 250 (more precisely, the first and second covering sections 242 and 252) may be set to mutually different refractive indexes. Concretely, the first protection layer 240 may be set to a refractive index different from that of the topmost layer (for example, an (Al) GaAs layer with a lower Al composition) of the second mirror 126, and the second protection layer 250 may be set to a refractive index different from that of the first protection layer 240. By so doing, the first and second protection layers 240 and 250 can be functioned as mirrors, and made to contribute to light emission or light incidence. Accordingly, for example, the second mirror 126 can be madder thinner, and the resistance of the element can be further lowered.

As a further modified example of the example shown in FIG. 14, only the first protection layer 240 may be formed on the optical surface 128. In other words, the optical surface 128 may be covered only by the first protection layer 240 (the first covering section 242). The resultant effects in this case are the same as described above.

The present invention is not limited to the embodiments described above, and many modifications can be made. For example, the present invention may include compositions that are substantially the same as the compositions described in the embodiments (for example, a composition with the same function, method and result, or a composition with the same objects and result). Also, the present invention includes compositions in which portions not essential in the compositions described in the embodiments are replaced with others. Also, the present invention includes compositions that achieve the same functions and effects or achieve the same objects of those of the compositions described in the embodiments. Furthermore, the present invention includes compositions that include publicly known technology added to the compositions described in the embodiments.

What is claimed is:

1. An optical element comprising:
    a substrate;
    a columnar section that is formed above the substrate and has an upper surface for light emission or light incidence;
    a first protection layer formed above the substrate in a region including at least a circumference of the columnar section;
    a resin layer formed above the first protection layer;
    a second protection layer formed above the resin layer; and
    an electrode that is electrically connected to the upper surface of the columnar section,
    wherein the first and second protection layers are composed of a material harder than the resin layer.

2. An optical element according to claim 1, wherein the electrode extends from the upper surface of the columnar section to an area above the resin layer, and has a pad section above the resin layer.

3. An optical element according to claim 1, wherein the first protection layer is formed on a side surface of the columnar section and on an edge section of the upper surface of the columnar section.

4. An optical element according to claim 1, wherein the second protection layer is provided between the resin layer and the electrode.

5. An optical element according to claim 4, wherein the second protection layer extends to an inner side of the upper surface of the columnar section farther inside than the first protection layer and the resin layer.

6. An optical element according to claim 1, wherein the second protection layer is formed above the electrode.

7. An optical element according to claim 6, wherein the second protection layer extends to an inner side of the upper surface of the columnar section farther inside than the first protection layer, the resin layer and the electrode.

8. An optical element according to claim 6, farther comprising a third protection layer formed between the resin layer and the electrode, wherein the third protection layer is composed of a material harder than the resin layer.

9. An optical element according to claim 1, wherein at least one of the first and second protection layers covers an inner region on the upper surface of the columnar section farther inside than the electrode on the upper surface of the columnar section.

10. An optical element according to claim 1, wherein both of the first and second protection layers cover an inner region on the upper surface of the columnar section farther inside than the electrode on the upper surface of the columnar section, and the first and second protection layers have mutually different refractive indexes.

11. An optical element according to claim 1, wherein at least one of the first and second protection layers includes a compound of silicon, and oxygen or nitrogen.

12. An optical element according to claim 1, wherein at least the resin layer is formed in a circumference of the columnar section, the first protection layer contacts the second protection layer in a circumference of an outer edge of the resin layer.

13. An optical element according to claim 1, wherein the second protection layer contacts the substrate in a circumference of an outer edge of the first protection layer.

* * * * *